United States Patent
Jang et al.

[11] Patent Number: 6,143,673
[45] Date of Patent: Nov. 7, 2000

[54] METHOD FOR FORMING GAP FILLING SILICON OXIDE INTERMETAL DIELECTRIC (IMD) LAYER FORMED EMPLOYING OZONE-TEOS

[75] Inventors: Syun-Ming Jang, Hsin-Chu; Ying-Ho Chen, Taipei; Shwangming Jeng, Hsin-Chiu; Chen-Hua Yu, Hsin-Chu, all of Taiwan

[73] Assignee: Taiwan Semiconductor Manufacturing Company, Hsin-Chu, Taiwan

[21] Appl. No.: 09/409,888

[22] Filed: Oct. 1, 1999

[51] Int. Cl.⁷ .................................................. H01L 21/31
[52] U.S. Cl. ..................... 438/790; 438/780; 438/778; 438/788; 438/789; 257/752; 257/758
[58] Field of Search .................................. 438/778, 780, 438/788, 789, 790; 257/752, 758

[56] References Cited

U.S. PATENT DOCUMENTS

| | | | |
|---|---|---|---|
| 4,886,765 | 12/1989 | Chen et al. | 437/200 |
| 5,270,264 | 12/1993 | Andideh et al. | 437/228 |
| 5,416,048 | 5/1995 | Blalock et al. | 437/228 |
| 5,536,681 | 7/1996 | Jang et al. | 437/195 |
| 5,563,104 | 10/1996 | Jang et al. | 437/235 |
| 5,599,740 | 2/1997 | Jang et al. | 437/190 |
| 5,661,093 | 8/1997 | Ravi et al. | 438/763 |
| 5,679,606 | 10/1997 | Wang et al. | 437/195 |
| 5,759,913 | 6/1998 | Fulford, Jr. et al. | 438/624 |
| 5,872,401 | 2/1999 | Huff et al. | 257/758 |

*Primary Examiner*—David Nelms
*Assistant Examiner*—Reneé R. Berry
*Attorney, Agent, or Firm*—George O. Saile; Stephen B. Ackerman

[57] ABSTRACT

A method for forming within a microelectronics fabrication a dielectric layer formed over, around and between patterned conductor layers. There is first provided a substrate employed within a microelectronics fabrication upon which is formed a patterned conductor layers. There is then formed over the patterned conductor layer a silicon oxide dielectric layer. There is then treated the silicon oxide dielectric layer to an anisotropic sputter etching process to remove silicon oxide dielectric material without re-deposition from the bottom of the gap between lines of the patterned conductor layer and to reform the silicon oxide dielectric layers on the sidewalls of the patterned lines to form spacer layers thereon. Both the silicon oxide dielectric layer deposition process and the sputter etching process may be repeated as desired to form the desired depth of trench and shape of spacer layer. There is then exposed the substrate to a nitrogen plasma. There is then formed over the substrate a gap filling silicon oxide dielectric layer to complete the formation of the inter-level dielectric layer with minimal void content in gaps between patterned lines.

16 Claims, 3 Drawing Sheets

METHOD FOR FORMING GAP FILLING SILICON OXIDE INTERMETAL DIELECTRIC (IMD) LAYER FORMED EMPLOYING OZONE-TEOS

BACKGROUND OF THE INVENTION

1. Field of the Invention

This invention relates to methods for the fabrication of dielectric layers employed within microelectronics fabrications. More particularly, the invention relates to methods for the formation of dielectric layers for inter-level separation of patterned conductor layers within microelectronics fabrications.

2. Description of the Related Art

Microelectronics fabrications are formed from microelectronics substrates over which are formed patterned microelectronics conductor layers which are separated by microelectronics dielectric layers.

As the level of integration of microelectronics devices has increased and the dimensions of microelectronics devices have decreased, the spacing between adjacent conductor layers has correspondingly decreased, and the separation between adjacent conductor lines within a patterned conductor layer has also diminished. It is desirable to form a dielectric layer over and around the conductor lines and between successive patterned conductor layers uniformly without voids or other defects.

The increased density of circuit per unit area of substrate has also created a need for greater complexity and density of interconnections between components and circuits. This has necessitated the use of multiple levels of interconnection layers, requiring that the dielectric layers separating levels of interconnection layers be fabricated with flat, smooth upper surfaces to permit formation of closely spaced conductor line patterns upon the underlying dielectric layer surfaces by conventional photolithographic methods which have very limited depth of focus for pattern image formation.

Of the methods and materials which may be employed to form dielectric layers disposed between and around the patterns and lines of patterned microelectronics conductor layers, silicon containing dielectric materials including but not limited to silicon oxide dielectric materials, silicon nitride dielectric materials and silicon oxynitride dielectric materials formed by methods including but not limited to sub-atmospheric pressure thermal chemical vapor deposition (SACVD), plasma enhanced chemical vapor deposition (PECVD), physical vapor deposition (PVD) sputtering, reactive sputtering and spin-on-glass (SOG) methods have been found to be satisfactory. In particular, the filling in of narrow gaps within the conductor layers is especially well accomplished by employing gap filling layers of silicon oxide formed by SACVD methods employing ozone ($O_3$) gas and tetra-ethyl-ortho-silicate (TEOS) vapor.

The employment of gap filling silicon oxide materials for forming dielectric layers between and around patterned conductor layers is not without problems, particularly as the separations between conductor lines become smaller. A narrow gap between lines tends to be covered over at the top before all of the inner region is filled, leaving a void or "keyhole" in the interior of the dielectric material otherwise filling the gap. The presence of voids in the dielectric layer is not necessarily undesirable per se from the standpoint of the dielectric constant of the dielectric layer, but such voids are essentially structural defects in the dielectric layer. These void defects would result in a loss of the structural integrity and the chemical inertness of the dielectric layer. These void defects are particularly undesirable if formation of a flat, smooth upper surface of the dielectric layer for subsequent conductor line pattern formation is accomplished by, for example, chemical mechanical polish (CMP) planarization. The method of CMP planarization, which is commonly employed for this purpose, would be likely to uncover such voids and produce an irregular and defective surface.

It is therefore towards the goal of providing improved methods for forming gap filling dielectric layers within microelectronics fabrications that the present invention is generally and more specifically directed.

Various methods have been disclosed to form dielectric layers suitable for inter level metal dielectric (IMD) layers within microelectronics fabrications.

For example, Andideh et al., in U.S. Pat. No. 5,270,264, disclose a method for filling narrow, high aspect ration gaps between conductor lines with a high quality inter-level metal dielectric material. The method employs a first dielectric layer deposited over and around adjacent conductors, followed by sputtering in a rare gas plasma to re-deposit dielectric material within and alongside the gap between the conductor lines, and then filling the gap with a second dielectric layer formed employing chemical vapor deposition (CVD) of silicon dioxide.

Further, Blalock et al., in U.S. Pat. No. 5,416,048, disclose a method for forming conductor lines with improved edge step coverage by a dielectric layer subsequently deposited over the conductor line. The method forms sloped profiles of conductor line edges by preferential sputter etching and oxidizing the conductor line material causing it to re-deposit along the sides of the conductor line and on the underlying substrate.

Still further, Ravi et al., in U.S. Pat. No. 5,661,093, disclose a method for increasing the moisture resistance of an interlevel dielectric layer of silicon oxide containing a halogen by minimizing halogen outgassing. The layer is formed by successive deposition of silicon oxide with halogen or other dopants to build up the desired final layer thickness.

Yet still further, Wang et al., in U.S. Pat. No. 5,679,606, disclose a method for forming a thick planar inter-level dielectric layer over metal conductor lines. The method employs an electron cyclotron resonance (ECR) process to deposit a silicon containing dielectric layer over aluminum-copper conductor lines, followed by deposition of a gap filling dielectric layer including argon gas flow and radiofrequency power to insure gap filling and enhanced planarization. The process may be repeated to achieve the final desired thickness. Finally, a capping layer is deposited to complete the gap filling and achieve the desired planarization.

Finally, Fulford Jr. et al., in U.S. Pat. No. 5,759,913, disclose a method for forming between interconnect lines, a dielectric layer having air gaps within its structure between the interconnect lines. The air gaps form due to the outgassing of a hygroscopic material layer, previously formed at the bottom of the separation between the interconnect lines, during the deposition of the dielectric layer between and around the interconnect lines, favoring the deposition of dielectric material along the sides of the lines. To complete the covering of the air gap thus formed, the deposition temperature is decreased to decrease the outgassing, allowing the dielectric layer to cover over the separation between the interconnect lines.

Desirable within the art are additional methods which may be employed for forming void-free dielectric layers for inter-level separation of conductor layers within a microelectronics fabrication. More particularly desirable in the art of integrated circuit microelectronics fabrication are additional methods for forming void-free dielectric layers to fill narrow gaps between closely spaced conductor lines and to separate patterned conductor levels while allowing formation of planarized surfaces of the dielectric layers.

It is towards the foregoing goals that the present invention is both generally and more specifically directed.

SUMMARY OF THE INVENTION

A first object of the present invention is to provide a method for forming within a microelectronics fabrication a dielectric layer over and between a patterned conductor layer.

A second object of the present invention is to provide a method in accord with the first object of the present invention, where the microelectronics fabrication is an integrated circuit microelectronics fabrication.

A third object of the present invention is to provide a method of accord with the first object of the present invention or the second object of the present invention, where the method is readily commercially implemented.

In accord with the objects of the present invention, there is provided by the present invention a method for forming within a microelectronics fabrication a dielectric layer formed over, around and between patterned conductor layers. To practice the method of the present invention, there is first provided a substrate employed within a microelectronics fabrication upon which is formed a patterned conductor layer. There is formed over the patterned conductor layer a silicon oxide dielectric layer. There is then treated the silicon oxide dielectric layer to an anisotropic argon sputter etching process to remove silicon oxide dielectric material from the bottom of the gap without re-deposition and reform the silicon oxide dielectric material on the sidewalls of the gap to form spacer layers thereon. Both the deposition process and sputter etching process may be repeated as desired. There is then exposed the microelectronics fabrication to a nitrogen plasma. There is then formed over the substrate a gap filling silicon oxide layer to complete the inter-level dielectric layer with minimal void content within gaps between lines.

The present invention provides a method for forming upon a substrate employed within a microelectronics fabrication an inter-level dielectric layer with enhanced gap filling formed over and between patterned conductor layers employing a gap filling silicon oxide dielectric layer. The method achieves the object by employing an anisotropic sputter etching method for forming trenches between patterned lines and spacer layers on the sidewalls thereon.

The method of the present invention is practiced employing methods and materials which are known in the art of microelectronics fabrication in a novel order and arrangement. Since the methods and materials employed in the present invention are known in the art of microelectronics fabrication, the method of the invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming upon a patterned microelectronics layer upon a substrate employed within a microelectronics fabrication an inter-level dielectric layer formed employing a gap filling silicon oxide dielectric material.

The method of the present invention may be employed in forming inter-level metal dielectric (IMD) layers within microelectronics fabrications including but not limited to integrated circuit microelectronics fabrications, charge coupled device microelectronics fabrications, solar cell microelectronics fabrications, ceramics substrate microelectronics fabrications and flat panel display microelectronics fabrications.

First Preferred Embodiment

Figure 1:
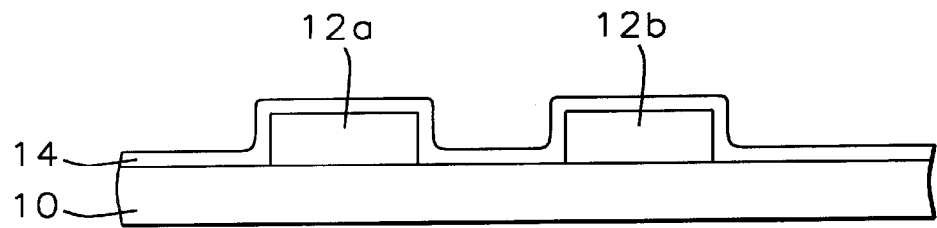
FIG. 1, FIG. 2, FIG. 3 and FIG. 4 are directed towards a general embodiment of the present invention which constitutes a first preferred embodiment of the present invention. Shown in FIG. 1 to FIG. 4 is a series of schematic cross-sectional diagrams illustrating the results of forming upon a patterned microelectronics layer upon a substrate employed within a microelectronics fabrication an inter-level dielectric layer, over and around the patterned microelectronics layer, employing a gap filling silicon oxide material.
Figure 2:
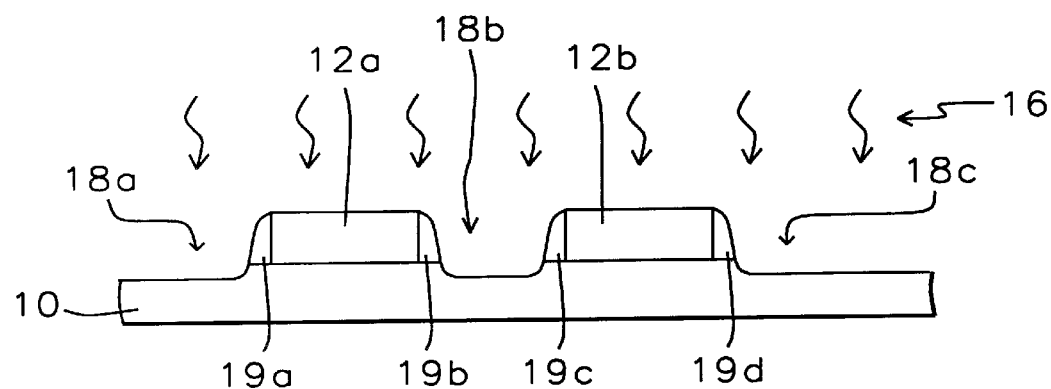
Figure 3:
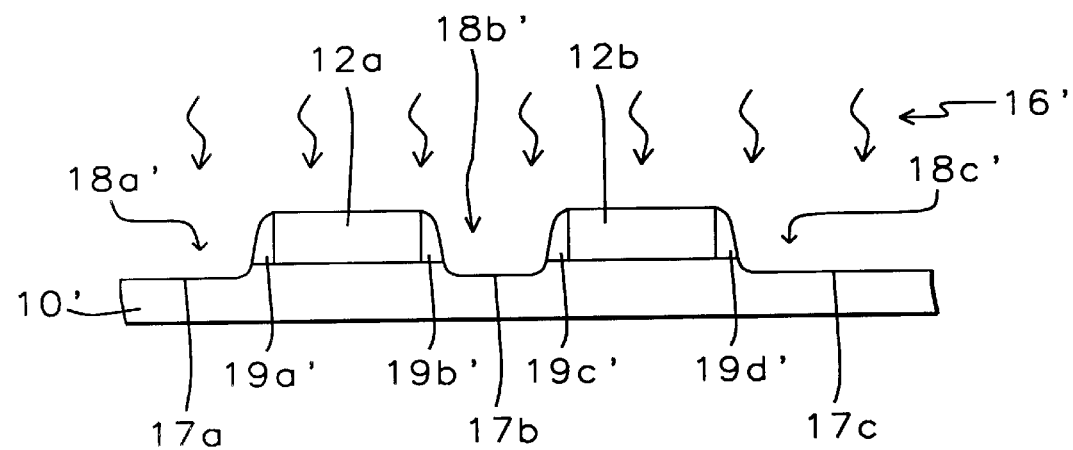

Referring now to FIG. 1 to FIG. 3, there is shown a series of schematic cross-sectional diagrams illustrating the results of forming, upon a patterned microelectronics layer upon a substrate employed within a microelectronics fabrication is accord with a general embodiment of the present invention which constitutes a first preferred embodiment of the present invention, a dielectric layer employing a sub-atmospheric pressure chemical vapor deposition (SACVD) method to deposit a gap filling silicon oxide dielectric material forming the inter-level dielectric layer. The patterned microelectronics layer may be selected from the group including but not limited to microelectronics conductor layers, microelectronics semiconductor layers and microelectronics dielectric layers. FIG. 1 is a schematic cross-sectional diagram of the microelectronics fabrication at an early stage in its fabrication according to the method of the first preferred embodiment of the present invention.

Shown in FIG. 1 is a substrate 10 employed within a microelectronics fabrication, where the substrate 10 has formed upon it a series of patterned lines 12a and 12b which comprise a patterned microelectronics layer. Formed over the patterned microelectronics layer is a blanket dielectric layer 14.

Within the first preferred embodiment of the present invention, the substrate 10 may be a substrate itself employed within the microelectronics fabrication, or alternatively the substrate 10 may be a substrate employed within the microelectronics fabrication, where the substrate has any of several additional microelectronics layers formed thereupon or thereover. Such additional microelectronics substrate layers (similarly with the substrate 10 itself) may include but are not restricted to microelectronics conductor substrate layers, microelectronics semiconductor substrate layers and microelectronics dielectric substrate layers.

With respect to the series of patterned lines 12a and 12b which comprise a patterned microelectronics layer, the patterned microelectronics layer may be selected from a group including but not limited to microelectronics conductor layers, microelectronics semiconductor layers and microelectronics dielectric layers formed employing methods including but not limited to thermal assisted evaporation methods, electron beam evaporation methods, chemical vapor deposition (CVD) methods and physical vapor deposition (PVD) sputtering methods. The patterned microelectronics layer is formed employing photolithographic and etching methods and materials as are well known in the art of microelectronics fabrication. Preferably, the patterned lines 12a and 12b comprising a patterned microelectronics layer are formed from a polysilicon layer employing low pressure chemical vapor deposition (LPCVD). Preferably the polysilicon layer is formed to a thickness of from about 2000 to about 3000 angstroms.

With respect to the blanket dielectric layer 14, the dielectric layer 14 is formed from silicon containing dielectric materials including but not limited to silicon oxide dielectric materials, silicon nitride dielectric materials and silicon oxynitride dielectric materials formed employing methods including but not limited to plasma enhanced chemical vapor deposition (PECVD) methods, sub-atmospheric pressure thermal chemical vapor deposition (SACVD) methods, physical vapor deposition (PVD) sputtering methods and reactive sputtering methods. Preferably, the dielectric layer 14 is formed of silicon oxide dielectric material in two deposition steps: 1) plasma enhanced chemical vapor deposition (PECVD) employing silane ($SiH_4$) and nitrous oxide ($N_2O$) gases; and 2) sub-atmospheric pressure thermal chemical vapor deposition (SACVD) employing ozone-TEOS gases to form a composite silicon oxide dielectric layer. The component layers 1) and 2) are preferably each formed to a thickness of about 1000 angstroms. An optional step, not shown in FIG. 1, may be performed to expose the first silicon containing dielectric layer to a nitrogen plasma prior to deposition of the second silicon containing dielectric layer. Preferably, the nitrogen plasma treatment process employs: (1) nitrogen gas pressure of from about 1 to about 2 torr; (2) nitrogen gas flow rate of from about 400 to about 600 standard cubic centimeters per minute (sccm); (3) power of from about 450 to about 550 watts at a frequency of 13.56 mHz; (4) temperature of from about 350 to about 430 degrees centigrade; and (5) helium gas flow rate of from about 1500 to about 2500 standard cubic centimeters per minute (sccm).

Referring now to FIG. 2, there is shown a schematic cross-sectional diagram illustrating the results of further processing of the microelectronics fabrication whose schematic cross-sectional diagram is shown in FIG. 1. Shown in FIG. 2 is a schematic cross-sectional diagram of a microelectronics fabrication otherwise equivalent to the microelectronics fabrication shown in FIG. 1, but wherein the microelectronics fabrication has been exposed to an anisotropic sputter etching process 16 resulting in the removal of material from the blanket dielectric layer 14 without re-deposition to form shallow trenches 18a, 18b and 18c at the bottom of the gaps separating patterned lines 12a and 12b of the patterned microelectronics layer. The anisotropic sputter etching process 16 also removes preferentially upper portions of the blanket dielectric layer 14 which are adherent to the dies of the patterned lines 12a and 12b to form without re-deposition on the sidewalls spacer layers 19a, 19b, 19c and 19d, decreasing in thickness from bottom to top of the patterned lines 12a and 12b.

With respect to the anisotropic sputter etching process 16, the anisotropic sputter etching process 16 employes ions formed from argon gas. Preferably, the sputter etching process employs: (1) argon gas flow rate of about 5 to about 10 standard cubic centimeters per minute (sccm); (2) argon pressure of about 0.3 to about 0.6 torr; (3) power of about 100 to about 400 watts; and (4) substrate temperature of about 25 to about 50 degrees centigrade.

Referring now to FIG. 3, there is shown a schematic cross-sectional diagram illustrating the results of further processing of the microelectronics fabrication whose schematic cross-sectional diagram is shown in FIG. 2. Shown in FIG. 3 is a microelectronics fabrication otherwise equivalent to the microelectronics fabrication shown in FIG. 2, but where there has been further exposed the substrate to an anisotropic sputter etching process 18 so as to remove a small further portion of the sidewalls 19a, 19b, 19c and 19d and to etch the substrate 10 at the bottom of the trenches 18a, 18b and 18c creating trench extensions 17a, 17b and 17c into the substrate 10 with extended trenches 18a', 18b' and 18c' within the substrate 10.

With respect to the further sputter etching process 18 shown in FIG. 3, the further sputter etching process 18 may be a repetition of the sputter etching process 16 shown in FIG. 2 of the first preferred embodiment of the present invention. Additionally, not shown in FIG. 2 is an optional deposition of silicon oxide dielectric material prior to a further sputter etching process if desired to provide additional thickness of a blanket dielectric layer analogous to the blanket dielectric layer 14 prior to sputter etching. The remaining sidewall portions which constitute the spacer layers 19a', 19b', 19c' and 19d' of the blanket dielectric layer 14 are nearly unaffected by any further sputter etching 18 because of the anisotropic nature of the sputter etching process.

Figure 4:
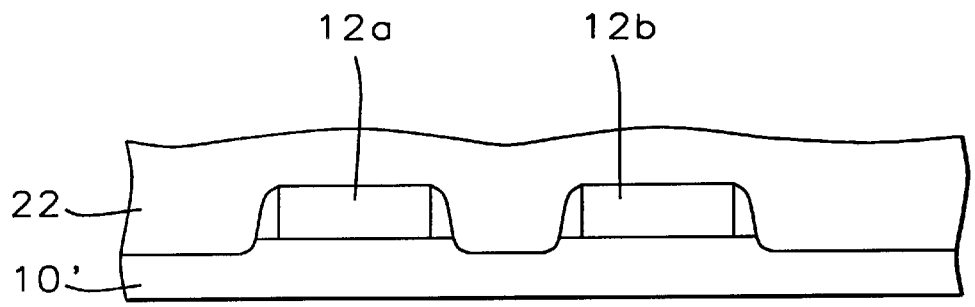

Referring now to FIG. 4, there is shown a schematic cross-sectional diagram illustrating the results of further processing of the microelectronics fabrication whose schematic cross-sectional diagram is shown in FIG. 3. Shown in FIG. 4 is a schematic cross-sectional diagram of a microelectronics fabrication otherwise equivalent to the microelectronics fabrication shown in FIG. 3, but wherein there has been exposed the substrate to a nitrogen plasma prior to forming over the substrate a gap filling dielectric layer 22.

With respect to the gap filling silicon oxide layer 22, the gap filling silicon oxide dielectric layer 22 is formed employing a sub-atmospheric pressure thermal chemical vapor deposition (SACVD) method employing ozone ($O_3$) gas and tetra-ethyl-ortho-silicate (TEOS) vapor. Preferably, the formation of the gap filling silicon oxide dielectric layer employs: (1) ozone gas flow rate of about 5000 to about 5700 standard cubic centimeters per minute (sccm); (2) TEOS vapor flow rate of about 250 to about 350 milligrams per minute (mg/min); (3) temperature of about 350 to about 430 degrees centigrade; (4) pressure of about 400 to about 500 torr; and (5) helium carrier gas flow rate of from about 2000 to about 4000 standard cubic centimeters per minute (sccm).

With respect to the nitrogen plasma treatment of the substrate prior to formation of the gap filling silicon oxide dielectric layer 22, the nitrogen plasma is analogous or equivalent to the optional nitrogen plasma process employed in FIG. 1 of the first preferred embodiment of the present invention.

The presence of the spacer layers 19a', 19b', 19c' and 19d' facilitate the complete filling of the gaps by the gap filling silicon oxide dielectric layer 22 and minimize the formation of voids between the patterned lines 12a and 12b upon deposition of the gap filling silicon oxide dielectric layer over the substrate to complete the formation of the inter-level dielectric layer over, around and between the patterned lines comprising the patterned microelectronics layer 12a and 12b.

Second Preferred Embodiment

Figure 5:
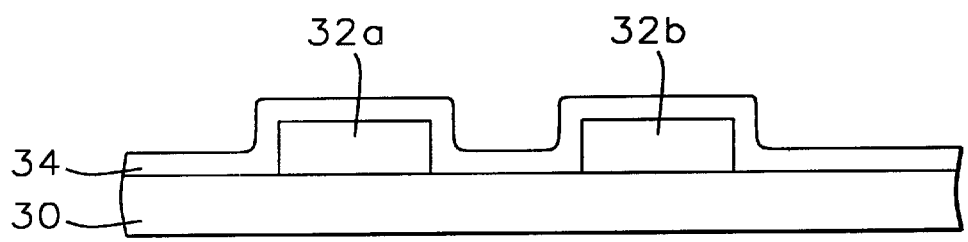
FIG. 5, FIG. 6, FIG. 7 and FIG. 8 are directed towards a more specific embodiment of the present invention which constitutes a second preferred embodiment of the present invention. Shown in FIG. 5 to FIG. 8 is a series of schematic cross-sectional diagrams illustrating the results of forming upon a patterned conductor layer upon a semiconductor substrate employed within an integrated circuit microelectronics fabrication an inter-level dielectric layer, over and between patterned conductor layers, employing a gap filling silicon oxide dielectric material formed employing a sub-atmospheric pressure chemical vapor deposition (SACVD) method.

Referring now to FIG. 5 to FIG. 8, there is shown a series of schematic cross-sectional diagrams illustrating the results of forming over, around and between a patterned conductor layer upon a semiconductor substrate employed within an integrated circuit microelectronics fabrication, in accord with a more specific embodiment of the present invention which constitutes a second preferred embodiment of the present invention, an inter-level dielectric layer. Shown in FIG. 5 is a schematic cross-sectional diagram illustrating an integrated circuit microelectronics fabrication at an early stage in its fabrication in accord with the method of the second preferred embodiment of the present invention.

Shown in FIG. 5 is a semiconductor substrate 30 upon which is formed a pair of patterned conductor lines 32a and 32b which comprise a patterned microelectronics conductor layer. Formed over the patterned conductor layer is a blanket dielectric layer 34.

With respect to the semiconductor substrate 30 shown in FIG. 5, the semiconductor substrate 30 is a silicon substrate analogous to the substrate 10 shown in FIG. 1 of the first preferred embodiment of the present invention. Preferably, the semiconductor substrate 30 is a silicon substrate of single-crystal (100) orientation with P- or N-type doping.

With respect to the pair of patterned conductor lines 32a and 32b, the patterned conductor lines 32a and 32b are analogous or equivalent to the patterned lines 12a and 12b which comprise the patterned microelectronics layer shown in FIG. 1 of the first preferred embodiment of the present invention. The patterned conductor lines 32a and 32b may be formed from microelectronics layers including but not limited to microelectronics metal layers, microelectronics alloy layers, microelectronics metallic compound layers, microelectronics semiconductor layers and microelectronics highly doped polycrystalline or amorphous silicon layers employing methods analogous to the methods employed to form the patterned microelectronics layers shown in FIG. 1 of the first preferred embodiment of the present invention. Preferably, the patterned conductor lines 32a and 32b are formed from polysilicon layer employing low pressure chemical vapor deposition, to a thickness of from about 2000 to about 3000 angstroms.

With respect to blanket dielectric layer 34, the blanket dielectric layer 34 is formed analogous or equivalent to the blanket dielectric layer 14 shown in FIG. 1 of the first preferred embodiment of the present invention, employing the method preferably described in the first preferred embodiment to form the component silicon containing dielectric layers of the composite dielectric layer, with exposure to a nitrogen plasma between the deposition of the first silicon containing dielectric layer and the deposition of the second silicon containing dielectric layer of the composite dielectric layer analogous or equivalent to the method shown in FIG. 1 of the first preferred embodiment of the present invention.

Figure 6:
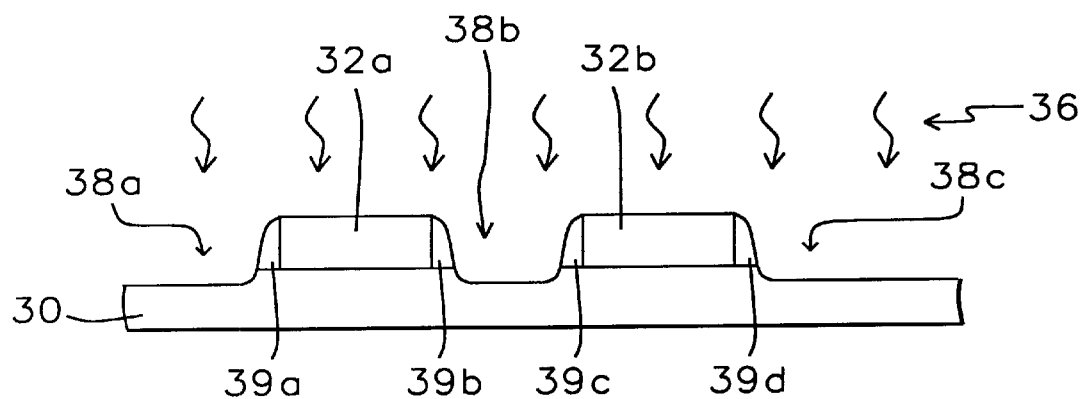

Referring now to FIG. 6, there is shown a schematic cross-sectional diagram illustrating the results of further processing of the integrated circuit microelectronics fabrication whose schematic cross-sectional diagram is shown in FIG. 5. Shown in FIG. 6 is an integrated circuit microelectronics fabrication otherwise equivalent to the integrated circuit microelectronics fabrication shown in FIG. 5, but wherein there has been exposed the surface of the substrate to an anisotropic sputter etching process employing argon ions 36 to remove dielectric material and form shallow trenches 38a, 38b and 38c at the bottom of the gaps between the patterned lines 32a and 32b of the patterned conductor layer. Also formed by removal of a portion of the blanket dielectric layer 34 from the sidewalls of the patterned lines 32a and 32b are sidewall deposits which constitute spacer layers 39a, 39b, 39c and 39d.

With respect to the anisotropic sputtering process 36, the anisotropic sputtering process 36 is analogous or equivalent to the anisotropic sputtering process 16 shown in FIG. 2 of the first preferred embodiment of the present invention. A portion of the dielectric material sputtered from the blanket dielectric layers 34 to reform sidewall layers as spacer layers 39a, 39b, 39c and 39d in decreasing thickness from the bottom to the top of the sidewalls.

Figure 7:
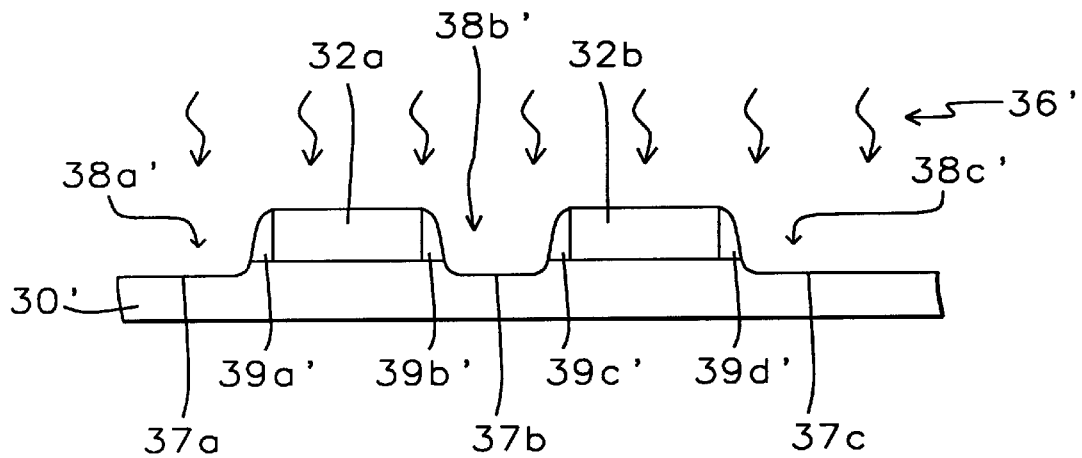

Referring now to FIG. 7, there is shown a schematic cross-sectional diagram illustrating the results of further processing of the integrated circuit microelectronics fabrication whose schematic cross-sectional diagram is shown in FIG. 6. Shown in FIG. 7 is an integrated circuit microelectronics fabrication otherwise to the integrated circuit microelectronics fabrication shown in FIG. 6, but wherein the formation of the blanket dielectric layer 34 and the sputter etching process 36 have been repeated so as to remove the desired amount of material from the substrate to form trench extensions 37, 37b and 37c into the substrate 30 at the bottom of the gaps between patterned conductor lines 32a and 32b to produce the desired depths of trenches 38a', 38b' and 38c'. The anisotropic sputter etching process 36 removes only a small further portion and forms the desired profiles of sidewalls 39a', 39b', 39c' and 39d' on the sides of the patterned conductor lines 32a and 32b.

With respect to the formation process of the blanket dielectric layer 34 and the sputter etching process 36 shown in FIG. 7, the formation process of the blanket dielectric layer 34 and the sputter etching process 36 essentially repeat processes previously shown in FIG. 6.

With respect to the shallow trenches extensions 37a', 37b' and 37c' shown in FIG. 7, trench extensions 37a', 37b' and 37c' are formed deeper by the sputter etching of the substrate 30 than the trenches 37a, 37b and 37c in FIG. 6.

Figure 8:
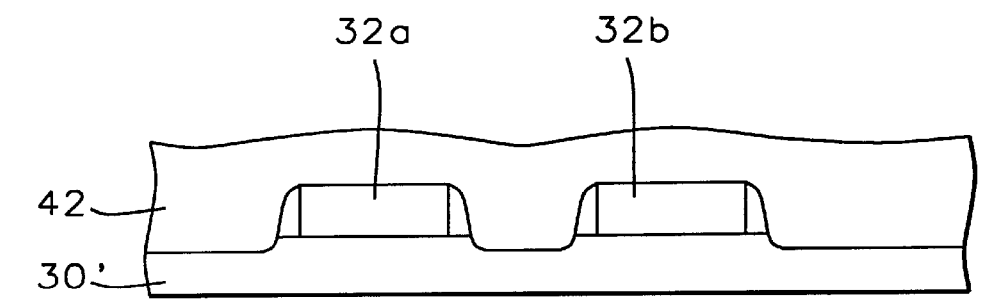

Referring now to FIG. 8, there is shown a schematic cross-sectional diagram illustrating the final results of further processing of the integrated circuit microelectronics fabrication whose schematic cross-sectional diagram is shown in FIG. 7. Shown in FIG. 8 is an integrated circuit microelectronics fabrication otherwise equivalent to the microelectronics fabrication shown in FIG. 7, but where there has been formed over the substrate a gap filling silicon oxide dielectric layer 42 after exposure of the substrate to a nitrogen plasma.

With respect to the nitrogen plasma employed to treat the substrate prior to formation of the gap filling silicon oxide gap filling dielectric layer 42, the nitrogen plasma is analogous or equivalent to the nitrogen plasma employed in FIG. 4 of the first preferred embodiment of the present invention.

With respect to the gap filling silicon oxide dielectric layer 42, the gap filling silicon oxide dielectric layer 42 is formed analogous or equivalent to the gap filling silicon oxide dielectric layer 22 shown in FIG. 4 of the first preferred embodiment of the present invention. The gaps filled by the gap filling silicon oxide layer 42 contain minimal voids between the patterned lines 32a and 32b due to the presence and shape of the spacer layers 39a', 39b', 39c' and 39d'.

The benefits and advantages of the present invention are particularly obtained by the deposition of silicon containing dielectric materials employing both plasma enhanced chemical vapor deposition (PECVD) and sub-atmospheric pressure thermal chemical vapor deposition (SACVD) methods. The former method (PECVD) is generally employed to form a first layer of silicon oxide dielectric material, for example, which is superior in uniformity of physical and chemical properties, while the latter method (SACVD) is superior in forming the gap filling conformal layers with acceptable physical properties.

The gap filling propensity of silicon oxide dielectric materials formed by sub-atmospheric pressure thermal chemical vapor deposition (SACVD) methods is enhanced by the method of the present invention by the formation of spacer layers on the sidewalls of gaps. The spacer layers minimize the tendency to form voids or "keyholes" in narrow gaps between lines.

As is understood by a person skilled in the art, the preferred embodiments of the present invention are illustrated of the present invention rather than limiting of the present invention. Revisions and modifications may be made to materials, structures and dimensions through which is provided the preferred embodiments of the present invention while still providing embodiments which are within the spirit, scope and intent of the present invention, as defined by the appended claims.

What is claimed is:

1. A method for forming upon a patterned microelectronics layer formed upon a substrate within a microelectronics fabrication a dielectric layer comprising:

providing a substrate employed within a microelectronics fabrication;

forming upon the substrate a patterned microelectronics layer;

forming upon the patterned microelectronics layer a sacrificial blanket dielectric layer;

exposing the substrate to an anisotropic sputter etching process to form from the sacrificial blanket dielectric layer without re-deposition a spacer layer formed on the sidewalls of the patterned microelectronics layer; and forming an inter-level dielectric layer over and around the patterned microelectronics layer.

2. The method of claim 1 wherein the microelectronics fabrication is selected from the group comprising:

integrated circuit microelectronics fabrications;

charge coupled microelectronics fabrications;

solar cell microelectronics fabrications;

ceramic substrate microelectronics fabrications; and flat panel display microelectronics fabrications.

3. The method of claim 1 wherein the patterned microelectronics layer is formed from the group comprising:

microelectronics conductor layers;

microelectronics semiconductor layers; and microelectronics dielectrics layers.

4. The method of claim 1 wherein the blanket dielectric layer is a composite layer formed of silicon containing dielectric sub-layers formed employing successive chemical vapor deposition (CVD) with an optional nitrogen plasma treatment between deposition of the silicon containing dielectric sub-layers.

5. The method of claim 1 wherein the anisotropic sputtering process is an argon sputtering process.

6. The method of claim 1 wherein the anisotropic sputtering process also etches the portion of the substrate between the patterned microelectronics lines.

7. The method of claim 1 wherein the substrate is exposed to a nitrogen plasma treatment after the anisotropic sputter etching process.

8. The method of claim 1 wherein the inter-level dielectric layer is a gap filling silicon oxide layer formed by ozone assisted sub-atmospheric pressure thermal chemical vapor deposition (SACVD) employing tetra-ethyl-ortho-silicate vapor.

9. A method for forming upon a patterned microelectronics conductor layer formed upon semiconductor substrate employed within an integrated circuit microelectronics fabrication an inter-level dielectric layer free of voids comprising:

providing a semiconductor substrate;

forming upon the semiconductor substrate a patterned microelectronics conductor layer;

forming over the patterned conductor layer a blanket silicon containing composite dielectric layer;

exposing the substrate to an anisotropic sputter etching process to remove a portion of the blanket silicon containing dielectric layer without re-deposition to form a spacer layer upon the sidewalls of the patterned conductor layer;

repeating the formation of the blanket silicon containing composite dielectric layer and the sputter etching of the substrate as often as desired to obtain the desired removal of dielectric material without re-deposition and to form spacer layers on the sidewalls of the patterned conductor layer; and forming an inter-level dielectric layer over and upon the substrate with minimal void content in gaps between lines.

10. The method of claim 9 wherein the semiconductor substrate is a silicon semiconductor substrate.

11. The method of claim 9 wherein the patterned microelectronics conductor layer is formed from a polycrystalline silicon layer employing the process of low pressure chemical vapor deposition.

12. The method of claim 9 wherein the blanket silicon containing dielectric layer is a composite layer formed of silicon containing dielectric sub-layers formed employing successive chemical vapor deposition (CVD) steps with an optional nitrogen plasma exposure treatment of the substrate between successive deposition steps.

13. The method of claim 8 wherein the anisotropic sputter etching process is carried out in argon gas.

14. The method of claim 8 wherein the inter-level dielectric layer is a gap filling silicon oxide layer formed by ozone assisted sub-atmospheric pressure thermal chemical vapor deposition (SACVD) employing tetra-ethyl-ortho-silicate vapor.

15. The method of claim 9 wherein the anisotropic sputtering process also etches the silicon substrate in the gaps between the lines comprising the patterned microelectronics conductor layer.

16. The method of claim 9 wherein the semiconductor substrate is exposed to a nitrogen plasma treatment after the anisotropic sputter etching process.

* * * * *